United States Patent
Kobayashi et al.

(10) Patent No.: US 9,954,055 B2
(45) Date of Patent: Apr. 24, 2018

(54) VERTICAL POWER MOSFET DEVICE

(71) Applicant: KABUSHIKI KAISHA TOSHIBA, Tokyo (JP)

(72) Inventors: Kenya Kobayashi, Nonoichi Ishikawa (JP); Masatoshi Arai, Hakusan Ishikawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/250,555

(22) Filed: Aug. 29, 2016

(65) Prior Publication Data
US 2017/0263699 A1 Sep. 14, 2017

(30) Foreign Application Priority Data
Mar. 8, 2016 (JP) .................. 2016-044988

(51) Int. Cl.
*H01L 29/06* (2006.01)
*H01L 29/10* (2006.01)
(Continued)

(52) U.S. Cl.
CPC ...... *H01L 29/0634* (2013.01); *H01L 29/1095* (2013.01); *H01L 29/404* (2013.01);
(Continued)

(58) Field of Classification Search
CPC ............... H01L 29/1095; H01L 29/407; H01L 29/41741; H01L 29/4236; H01L 29/42376;
(Continued)

(56) References Cited

U.S. PATENT DOCUMENTS

| | | | |
|---|---|---|---|
| 5,637,898 A | 6/1997 | Baliga | |
| 5,998,833 A | 12/1999 | Baliga | |

(Continued)

FOREIGN PATENT DOCUMENTS

JP  2008124346 A  5/2008

OTHER PUBLICATIONS

Y. Baba et al, "A study on a high blocking voltage UMOS-FET with a double gate structure," in Proc. of ISPSD '92, pp. 300-302.
(Continued)

*Primary Examiner* — Jarrett Stark
*Assistant Examiner* — Shahed Ahmed
(74) *Attorney, Agent, or Firm* — Patterson & Sheridan, LLP

(57) ABSTRACT

A semiconductor device includes a layer having first and second surfaces and a first type first region, a second type second region in the layer between the first region and first surface, a first type third region in the layer between the second region and first surface, first and second gate electrodes, wherein the second region is between the first and second gate electrodes, a first field plate electrode between the second surface and first gate electrode, a second field plate electrode between the second surface and second gate electrode, a first film, at least a portion between the first field plate electrode and first region, a second film at least a portion between the second field plate electrode and first region, and a second type fourth region in the first region between the first and second films. A portion of the first region is between second and fourth regions.

20 Claims, 7 Drawing Sheets

(51) Int. Cl.
*H01L 29/40* (2006.01)
*H01L 29/78* (2006.01)

(52) U.S. Cl.
CPC .......... *H01L 29/407* (2013.01); *H01L 29/408* (2013.01); *H01L 29/7813* (2013.01)

(58) Field of Classification Search
CPC ........... H01L 29/66734; H01L 29/7813; H01L 29/41766; H01L 29/42368; H01L 29/0634; H01L 29/404; H01L 29/408
USPC ........ 257/330, 335, 520; 438/133, 270, 361, 438/429
See application file for complete search history.

(56) References Cited

U.S. PATENT DOCUMENTS

| | | | |
|---|---|---|---|
| 7,642,597 | B2 | 1/2010 | Saito |
| 8,686,495 | B1 | 4/2014 | Saito |
| 2008/0213960 | A1* | 9/2008 | Ninomiya ........... H01L 29/0634 438/268 |
| 2010/0078707 | A1* | 4/2010 | Haeberlen ........... H01L 29/7805 257/328 |
| 2013/0334598 | A1 | 12/2013 | Okumura |
| 2017/0025522 | A1* | 1/2017 | Naito ................... H01L 29/407 |

OTHER PUBLICATIONS

M. Kodama at al., "Temperature characteristics of a new 100V rated power MOSFET, VLMOS (vertical LOCOS MOS)," Proc of ISPSD '04, pp. 463-466.

G. E. J. Koops et al., "Resurf stepped oxide (RSO) MOSFET for 85V having a record-low specific on-resistance," in Proc. of ISPSD'04, pp. 185-188.

M. A. Gajda et al., "Industrialisation of resurf stepped oxide technology for power transistors," in Proc. of ISPSD'06, pp. 109-112.

P. Goarin et al., "Split-gate resurf stepped oxide (RSO) MOSFETs for 25 V applications with record low gate-to-drain charge," in Proc. of ISPSD'07, pp. 61-64.

J. Yedinak et al., "Optimizing Oxide Charge Balanced Devices for Unclamped Inductive Switching (UIS)," in Proc. of ISPSDlO, pp. 333-336.

Y. Chen et al., "Design of Gradient Oxide-Bypassed Superjunction Power MOSFET Devices," IEEE Trans on Power Electronics, vol. 22, No. 4, pp. 1303-1310.

J. Yedinak et al., "Avalanche Instability in Oxide Charge Balanced Power MOSFETS," in Proc. of ISPSD'11, pp. 156-159.

K. Kobayashi et al., "An 18V n-channel UMOSFET with super low on-resistance by using vertical resurf structure," in the Papers of Joint Technical Meeting, IEE Japan, EDD-12-068, SPC-12-141, pp. 49-53, 2012. (In Japanese).

Z. Hossain et al., "Process & Design Impact on BVDSS Stability of a Shielded Gate Trench Power MOSFET," in Proc. of ISPSD'14, pp. 378-381.

K. Kobayashi, T. Nishiguchi, S. Katoh, T. Kawano and Y. Kawaguchi, "100 V Class Multiple Stepped Oxide Field Plate Trench MOSFET (MSO-FP-MOSFET) Aimed to Ultimate Structure Realization," in Proc. of ISPSD'15, pp. 141-144.

S. Deng et al., "Doping Engineering for Improved Immunity against BV Softness and BV Shift in Trench Power MOSFET," in Proc. of ISPSD'16, pp. 375-378.

Z. Hossain et al., 3-D TCAD Simulation to Optimize the Trench Termination Design for Higher and Robust BVDSS, in Proc. of ISPSD'16, pp. 391-394.

* cited by examiner

US 9,954,055 B2

1

VERTICAL POWER MOSFET DEVICE

CROSS-REFERENCE TO RELATED APPLICATION

This application is based upon and claims the benefit of priority from Japanese Patent Application No. 2016-044988, filed Mar. 8, 2016, the entire contents of which are incorporated herein by reference.

FIELD

Embodiments described herein relate generally to a semiconductor device.

BACKGROUND

A vertical transistor in which the gate electrode is embedded in a trench is used in order to achieve miniaturization and high performance of a transistor. In the vertical transistor, a drain-to-source breakdown voltage (hereinafter, simply referred to as "breakdown voltage") and on-state resistance have a tradeoff relationship. That is, when the impurity concentration of the drift layer is increased so as to decrease the on-state resistance, the breakdown voltage is lowered. To the contrary, when the impurity concentration of the drift layer is decreased so as to improve the breakdown voltage, the on-state resistance is increased.

As a method of improving the tradeoff relationship between the breakdown voltage and the on-state resistance, a field plate electrode may be provided in the trench below the gate electrode. When the electric field distribution in the drift layer is changed by the presence of the field plate electrode, the breakdown voltage of the vertical transistor is improved in comparison to no field plate electrode when the impurity concentration of the drift layer is maintained the same.

In addition to the improvement of the on-state resistance and the breakdown voltage, it is desirable to decrease parasitic capacitance of the device. For example, in order to improve the switching efficiency of a transistor, it is desirable to decrease an output capacitance (Coss) and an output charge amount (Qoss) at the time of charging and discharging the output capacitance. In addition, in order to prevent switching noise of the transistor, it is desirable to optimize the change (hereinafter, referred to as Coss-Vds curve) of the output capacitance (Coss) in accordance with the change of a drain-to-source voltage (Vds).

DETAILED DESCRIPTION

Figure 1:
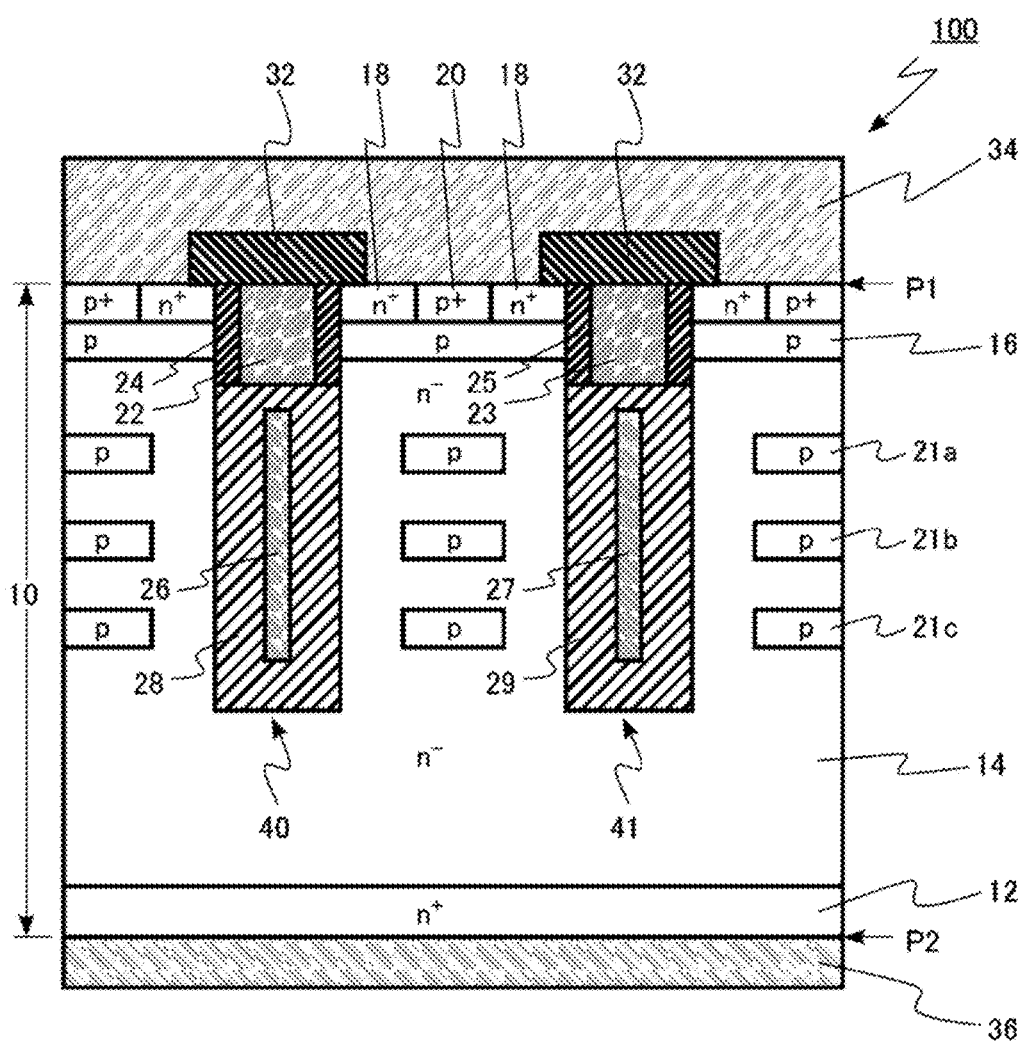
FIG. 1 is a schematic sectional view of a semiconductor device according to a first embodiment.

In general, according to one embodiment a semiconductor device includes a semiconductor layer having a first surface and a second surface, a first conductivity type first semiconductor region in the semiconductor layer, a second conductivity type second semiconductor region in the semiconductor layer between the first semiconductor region and the first surface, a first conductivity type third semiconductor region in the semiconductor layer between the second semiconductor region and the first surface, a first gate electrode, a second gate electrode, wherein the second semiconductor region is interposed between the first gate electrode and the second gate electrode, a first field plate electrode between the second surface and the first gate electrode, a second field plate electrode between the second surface and the second gate electrode, a first insulating film, at least a portion of which is provided between the first field plate electrode and the first semiconductor region, a second insulating film at least a portion of which is provided between the second field plate electrode and the first semiconductor region, and a second conductivity type fourth semiconductor region in the first semiconductor region between the first insulating film and the second insulating film. A portion of the first semiconductor region is between the second semiconductor region and the fourth semiconductor region.

Hereinafter, embodiments of the disclosure will be described with reference to the drawings. Note that, in the following description, the same or equivalent components are denoted by the same reference numerals and the description of the mentioned components will not be repeated.

In addition, in the following description, $n^+$, n, and $n^-$, and $p^+$, and p, represent relative levels of the impurity concentration in the respective conductivity types. That is, $n^+$ exhibits a relatively higher n-type impurity concentration than n, and $n^-$ exhibits a relatively lower n-type impurity concentration than n. In addition, $p^+$ exhibits a relatively higher p-type impurity concentration than p. Note that, $n^+$ type and $n^-$ type are simply referred to as n type, and $p^+$ type is simply referred to as p type in some cases.

The impurity concentration can be measured by using, for example, a secondary ion mass spectrometry (SIMS). Further, the relative level of the impurity concentration can be determined by the level of carrier concentration which is obtained by using, for example, the scanning capacitance microscopy (SCM). In addition, a position of an impurity region in the depth direction can be obtained by using, for example, the SIMS. Also, the position of the impurity region in the depth direction can be obtained from, for example, a synthetic image of an SCM image and an atomic force microscope (AFM) image.

First Embodiment

FIG. 1 is a schematic sectional view of a semiconductor device according to the embodiment. A semiconductor device 100 according to the embodiment is a vertical power metal oxide semiconductor field effect transistor (MOSFET) which includes a gate electrode in a trench. Hereinafter, a case where the first conductivity type is an n type, and the second conductivity type is a p type, that is, a case of an n-channel type MOSFET will be described.

The MOSFET 100 according to the embodiment includes a silicon layer (a semiconductor layer) 10. The silicon layer 10 includes an n⁺ type drain region 12, an n⁻ type drift region (the first semiconductor region) 14, a p-type body region (the second semiconductor region) 16, an n⁺ type source region (the third semiconductor region) 18, and a p⁺ type body contact region 20. A p-type first intermediate region (the fourth semiconductor region) 21a, a p-type second intermediate region (the fifth semiconductor region) 21b, and a p-type third intermediate region (a sixth semiconductor region) 21c are provided in the drift region 14.

In addition, the MOSFET 100 includes a first gate electrode 22, a second gate electrode 23, a first gate insulating film 24, a second gate insulating film 25, a first field plate electrode 26, a second field plate electrode 27, a first field plate insulating film (the first insulating film) 28, a second field plate insulating film (a second insulating film) 29, an interlayer insulating film 32, a source electrode 34, and a drain electrode 36. In addition, the MOSFET 100 includes a first trench 40 and a second trench 41.

The silicon layer 10 has the first surface (P1 in FIG. 1) and the second surface (P2 in FIG. 1). Hereinafter, the first surface is also referred to a front surface and the second surface is also referred to a rear surface.

The silicon layer 10 is monocrystalline silicon (Si). The front surface of the silicon layer 10 is inclined at an angle in a range from 0° to 8° with respect to a (100) crystal plane.

The n⁺ type drain region 12 is provided in the silicon layer 10 adjacent the second surface P2. The drain region 12 contains an n-type impurity. The n-type impurity in the drain region 12 is, for example, phosphorus (P) or arsenic (As). The concentration of the n-type impurity is, for example, in a range from $1\times10^{18}$ cm⁻³ to $1\times10^{21}$ cm⁻³.

The n⁻ type drift region 14 is provided in the silicon layer 10. The drift region 14 is provided on the drain region 12. The drift region 14 contains the n-type impurity. The n-type impurity in the drift region 14 is, for example, phosphorus (P) or arsenic (As). The concentration of the n-type impurity is, for example, in a range from $1\times10^{14}$ cm⁻³ to $1\times10^{17}$ cm⁻³. The drift region 14 is, for example, an epitaxial growth layer which is formed on the n⁺ type drain region 12 by epitaxial growth.

The drift region 14 includes a p-type first intermediate region 21a, a p-type second intermediate region 21b, and a p-type third intermediate region 21c. The first intermediate region 21a, the second intermediate region 21b and the third intermediate region 21c are provided in the drift region 14 in the region thereof interposed between the first field plate insulating film 28 and the second field plate insulating film 29.

A portion of the drift region 14 is interposed between the first intermediate region 21a and the body region 16. Portions of the drift region 14 are also interposed between the first intermediate region 21a and the first field plate insulating film 28 and between the first intermediate region 21a and the second field plate insulating film 29.

The second intermediate region 21b is provided between the first intermediate region 21a and the second surface. A portion of the drift region 14 is interposed between the second intermediate region 21b and the first intermediate region 21a. Portions of the drift region 14 are also interposed between the second intermediate region 21b and the first field plate insulating film 28 and between the second intermediate region 21b and the second field plate insulating film 29.

The third intermediate region 21c is provided between the second intermediate region 21b and the second surface. Portions of the drift region 14 are interposed between the third intermediate region 21c and the second intermediate region 21b, between the third intermediate region 21c and the first field plate insulating film 28, and between the third intermediate region 21c and the second field plate insulating film 29.

The first intermediate region 21a, the second intermediate region 21b, and the third intermediate region 21c are thus provided between the first trench 40 and the second trench 41. At least one portion of the first intermediate region 21a, the second intermediate region 21b, and the third intermediate region 21c is provided between the first field plate electrode 26 and the second field plate electrode 27.

A specific potential is not applied to the first intermediate region 21a, the second intermediate region 21b, and the third intermediate region 21c. The first intermediate region 21a, the second intermediate region 21b, and the third intermediate region 21c are floating regions.

The first intermediate region 21a, the second intermediate region 21b, and the third intermediate region 21c contain a p-type impurity. The p-type impurity of the intermediate regions 21a, b and c is, for example, boron (B). The concentration of the p-type impurity is higher than the concentration of the n-type impurity of the n-type drift region 14. The concentration of the p-type impurity is, for example, in a range from $1\times10^{16}$ cm⁻³ to $1\times10^{18}$ cm⁻³.

The first intermediate region 21a, the second intermediate region 21b, and the third intermediate region 21c are formed in the drift region 14 by performing ion implantation of the p-type impurity into the portions of the drift region 14 where intermediate regions 21a, b and c are to be formed, for example. The first intermediate region 21a, the second intermediate region 21b, and the third intermediate region 21c can be concurrently formed when the drift region 14 is formed by epitaxial growth.

Note that, here, a case where the number of the p-type intermediate regions is three is described; however, the number of the p-type intermediate regions may be one or two. In addition, the number of the p-type intermediate regions may be four or more.

The p-type body region 16 is provided in the silicon layer 10 between the drift region 14 and the front surface of the silicon layer 10. When the MOSFET 100 is turned on, a channel is formed in the portions of the drift region 14 in contact with the first gate insulating film 24 and the second gate insulating film 25.

The body region 16 contains the p-type impurity. The p-type impurity of the body region 16 is, for example, boron (B). The concentration of the p-type impurity is, for example, in a range from $1\times10^{16}$ cm⁻³ to $1\times10^{18}$ cm⁻³.

The n⁺ type source region 18 is provided in the silicon layer 10 between the body region 16 and the front surface of the silicon layer 10. The source region 18 contains the n-type impurity. The n-type impurity of the source region is, for example, phosphorus (P) or arsenic (As). The concentration of the n-type impurity is, for example, in a range from $1\times10^{19}$ cm⁻³ to $1\times10^{21}$ cm⁻³.

The p⁺ type body contact region 20 is provided in the silicon layer 10 between the body region 16 and the front surface. The body contact region 20 is interposed between two source regions 18.

The body contact region 20 contains the p-type impurity. The p-type impurity of the body contact region 20 is, for example, boron (B). The concentration of the p-type impurity is, for example, in a range from $1\times10^{19}$ cm⁻³ to $1\times10^{21}$ cm⁻³.

The first gate electrode 22 is provided in the first trench 40. The first gate electrode 22 is polycrystalline silicon containing, for example, the n-type impurity or the p-type impurity.

The second gate electrode 23 is provided in the second trench 41. The second gate electrode 23 is located such that the body region 16 is interposed between the second gate electrode 23 and the first gate electrode 22. The second gate electrode 23 is polycrystalline silicon containing, for example, the n-type impurity or the p-type impurity.

The first gate insulating film 24 is provided between the first gate electrode 22 and the body region 16. The first gate insulating film 24 is, for example, a silicon oxide film.

The second gate insulating film 25 is provided between the second gate electrode 23 and the body region 16. The second gate insulating film 25 is, for example, a silicon oxide film.

The first field plate electrode 26 is provided in the first trench 40. The first field plate electrode 26 is provided between the first gate electrode 22 and the rear surface of the silicon layer 10.

The first field plate electrode 26 causes the electric field distribution in the drift region 14 to change, and improves the breakdown voltage of the MOSFET 100 in a state where the MOSFET 100 is turned off. The first field plate electrode 26 is polycrystalline silicon containing, for example, the n-type impurity or the p-type impurity.

The second field plate electrode 27 is provided in the second trench 41. The second field plate electrode 27 is provided between the second gate electrode 23 and the rear surface of the silicon layer 10.

The second field plate electrode 27 causes the electric field distribution in the drift region 14 change, and improves the breakdown voltage of the MOSFET 100 in a state where the MOSFET 100 is turned off. The second field plate electrode 27 is polycrystalline silicon containing, for example, the n-type impurity or the p-type impurity.

The first field plate insulating film 28 is provided between the first field plate electrode 26 and the drift region 14. In addition, the first field plate insulating film 28 is interposed between the first field plate electrode 26 and the first gate electrode 22. The first field plate insulating film 28 is, for example, a silicon oxide film.

The first field plate insulating film 28 allows the first gate electrode 22 and the first field plate electrode 26 to be electrically separated from each other. The first field plate electrode 26 is fixed to, for example, a ground potential.

The second field plate insulating film 29 is provided between the second field plate electrode 27 and the drift region 14. In addition, the second field plate insulating film 29 is interposed between the second field plate electrode 27 and the second gate electrode 23. The second field plate insulating film 29 is, for example, a silicon oxide film.

The second field plate insulating film 29 allows the second gate electrode 23 and the second field plate electrode 27 to be electrically separated from each other. The second field plate electrode 27 is fixed to, for example, a ground potential.

The interlayer insulating film 32 is provided between first gate electrode 22 and the source electrode 34. In addition, an interlayer insulating film 32 is provided between second gate electrode 23 and the source electrode 34. The interlayer insulating film 32 allows the first gate electrode 22 and the source electrode 34, and the second gate electrode 23 and the source electrode 34 to be electrically separated from each other. The interlayer insulating film 32 is, for example, a silicon oxide film.

The source electrode 34 is provided on the first surface. The source electrode 34 is electrically connected to the source region 18 and the body contact region 20. The source electrode 34 is in contact with the source region 18 and the body contact region 20. The source electrode 34 is a metal electrode. The source electrode 34 is a stacked film of titanium (Ti) and aluminum (Al), for example.

The drain electrode 36 is provided on the second surface. The drain electrode 36 is electrically connected to the drift region 14 through the drain region 12. The drain electrode 36 is in contact with the drain region 12. The drain electrode 36 is a metal electrode. The drain electrode 36 is a stacked film of titanium (Ti), aluminum (Al), nickel (Ni), copper (Cu), silver (Ag), and gold (Au), for example.

Hereinafter, actions and effects of the semiconductor device of the embodiment will be described. FIGS. 2 to 5 are explanatory diagrams illustrating the actions and effects of the semiconductor device of the embodiment.

In order to improve the switching efficiency of the power MOSFET, it is desired to decrease an output capacitance (Coss) and an output charge amount (Qoss). In addition, in order to prevent switching noise of the power MOSFET, it is desired to optimize the change (Coss-Vds curve) of the output capacitance (Coss) in accordance with the change of a drain-to-source voltage (Vds).

The output capacitance (Coss) is a total sum of a drain-to-source capacitance (Cds) and a gate-to-drain capacitance (Cgd). In addition, the output charge amount (Qoss) is the product of the output capacitance (Coss) and the drain-to-source voltage (Vds), or a value obtained by integrating the output capacitance (Coss) by the drain-to-source voltage (Vds). Accordingly, when the output capacitance (Coss) is decreased, the output charge amount (Qoss) is decreased.

Figure 2:
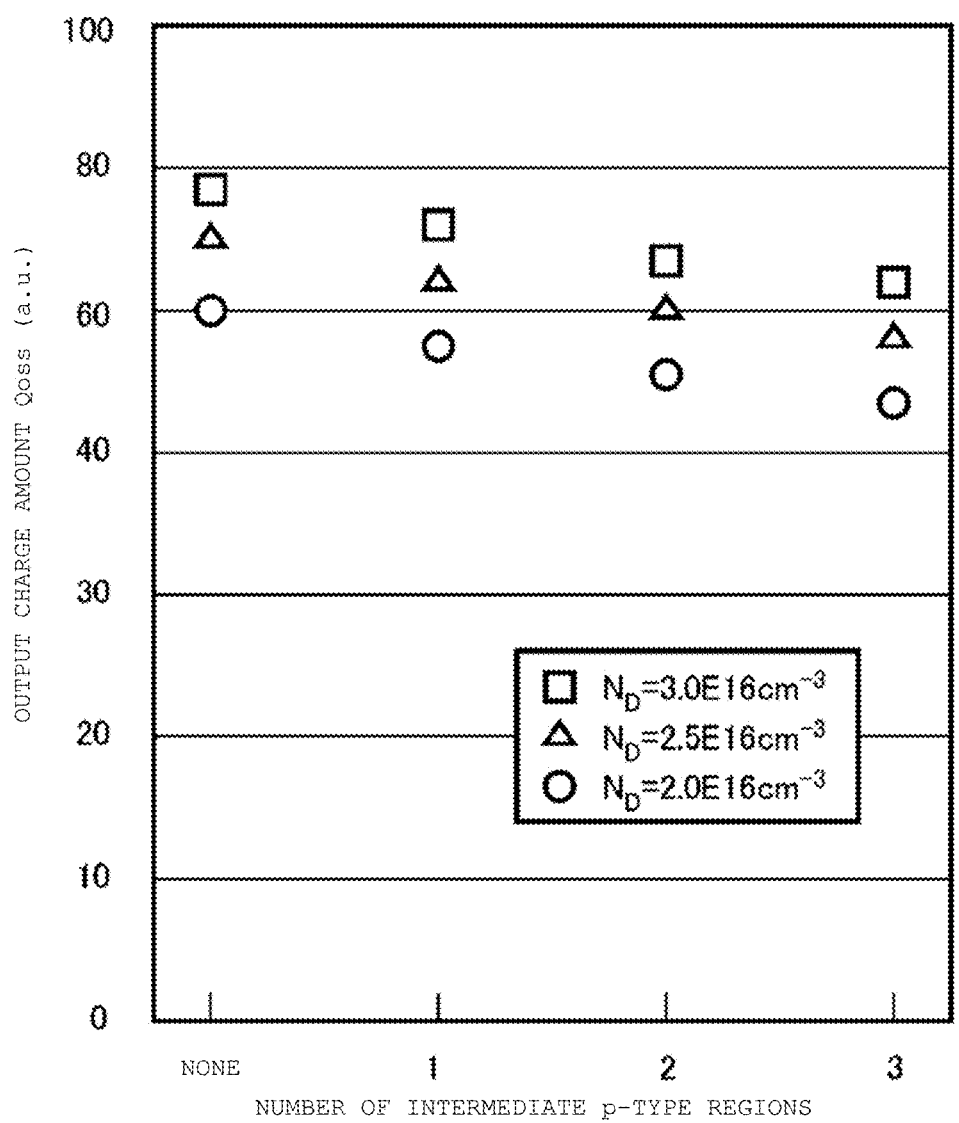
FIG. 2 is an explanatory diagram of an action and an effect of the semiconductor device according to the first embodiment.

FIG. 2 is a diagram illustrating a simulation result of the output charge amount (Qoss) of the MOSFET. The simulation result illustrates the output charge amount (Qoss) in a case where the p-type intermediate region (21) exists or not, and a case where the number of the p-type intermediate regions is changed. The simulation result illustrates a case where the concentration of the n-type impurity of the drift region 14 is $2.0 \times 10^{16}$ cm$^{-3}$, $2.5 \times 10^{16}$ cm$^{-3}$, and $3.0 \times 10^{16}$ cm$^{-3}$.

The output charge amount (Qoss) is decreased by providing the p-type intermediate region as compared with a case where no p-type intermediate region is provided. Regardless of the concentration of the n-type impurity of the drift region 14, the output charge amount (Qoss) is decreased. It is considered that the drift region 14 is promptly depleted by providing the p-type intermediate region when a voltage is applied between the drain and the source, and thus the output capacitance (Coss) is decreased, thereby decreasing the output charge amount (Qoss).

Figure 3:
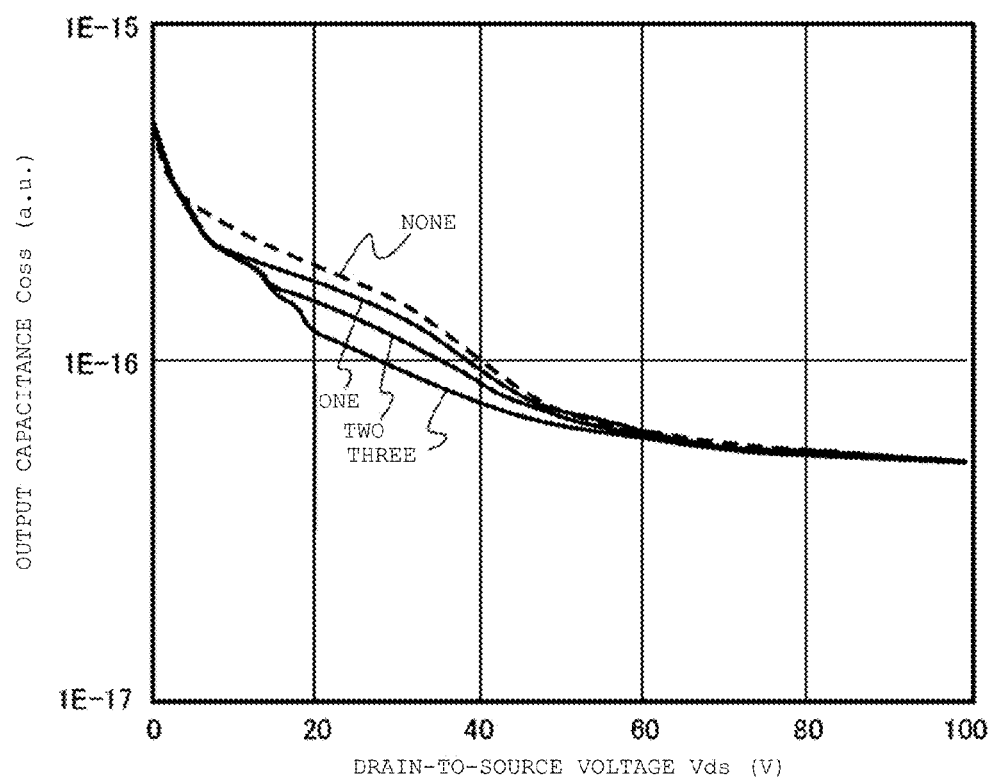
FIG. 3 is an explanatory diagram of an action and an effect of the semiconductor device according to the first embodiment.

FIG. 3 is a diagram illustrating a simulation result of the change (Coss-Vds curve) of the output capacitance (Coss) in accordance with the change of a drain-to-source voltage (Vds) of the MOSFET. The simulation result illustrates the Coss-Vds curve in a case where the p-type intermediate region (21) exists or not, and a case where the number of the p-type intermediate regions is changed. The horizontal axis represents a drain-to-source voltage (Vds), and the vertical axis represents the output capacitance (Coss).

It is obvious that the shape of the Coss-Vds curve is changed by providing the p-type intermediate region 21 as compared with a case where no p-type intermediate region is provided. Particularly, the output capacitance (Coss) is decreased in a range of the drain-to-source voltage (Vds) from 3 V to 60 V.

The depletion layer is widened into the n-type drift region 14 in accordance with the increase in the drain-to-source voltage (Vds). In this step, it is considered that when the depletion layer approaches the p-type intermediate region (21), the depletion is prompted at once over the width of the p-type intermediate region. The rapid depletion appears in the abrupt change of the Coss-Vds curve in FIG. 3. In FIG. 3, in a case where the number of the p-type intermediate regions is one, the abrupt change is confirmed once, in a case where the number of the p-type intermediate regions is two, the abrupt change is confirmed twice, and in a case where the number of the p-type intermediate regions is three, the abrupt change is confirmed three times.

Figure 4:
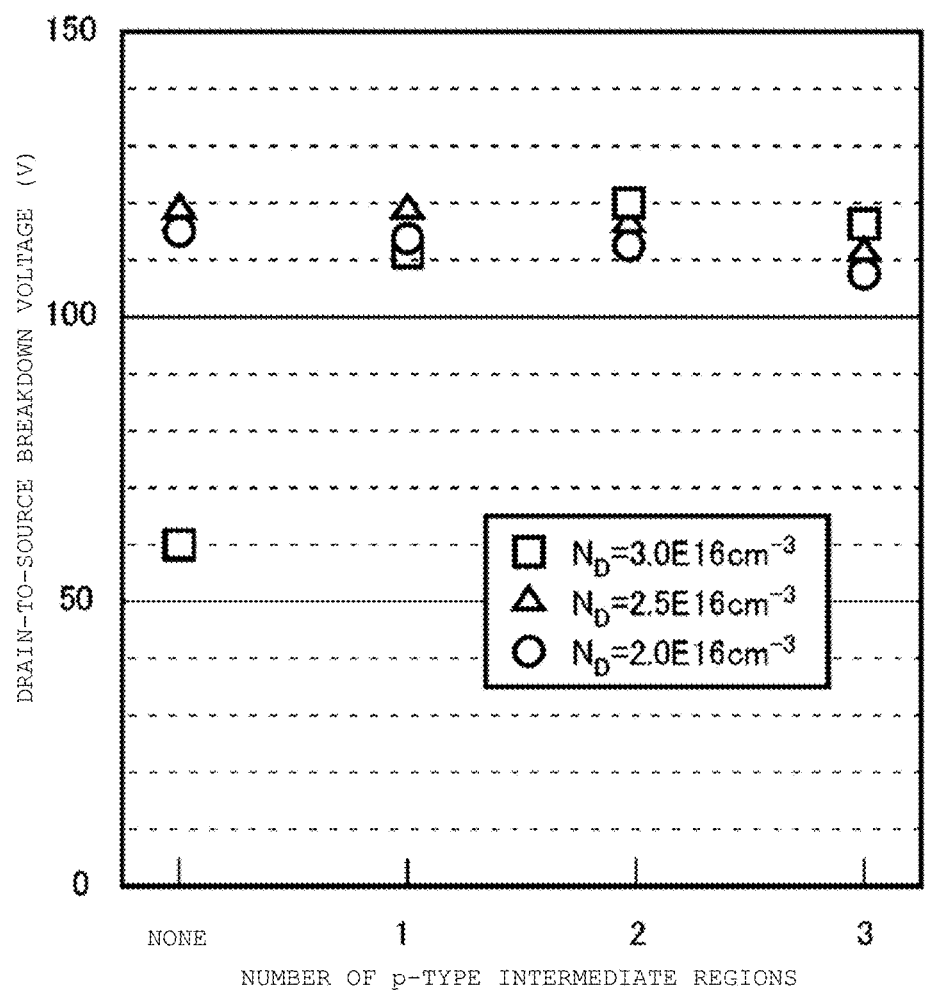
FIG. 4 is an explanatory diagram of an action and an effect of the semiconductor device according to the first embodiment.

FIG. 4 is a diagram illustrating a simulation result of the drain-to-source breakdown voltage of the MOSFET. The simulation result illustrates the drain-to-source breakdown voltage in a case where the p-type intermediate region exists or not, and a case where the number of the p-type intermediate regions is changed. The simulation result illustrates a case where the concentration of the n-type impurity of the drift region 14 is $2.0 \times 10^{16}$ cm$^{-3}$, $2.5 \times 10^{16}$ cm$^{-3}$, and $3.0 \times 10^{16}$ cm$^{-3}$.

A deteriorated drain-to-source breakdown voltage is not confirmed due to the provision of the p-type intermediate region as compared with a case where no p-type intermediate region is provided. In a case where the concentration of the n-type impurity of the drift region 14 is $3.0 \times 10^{16}$ cm$^{-3}$, the drain-to-source breakdown voltage is improved by providing the p-type intermediate region.

Figure 5:
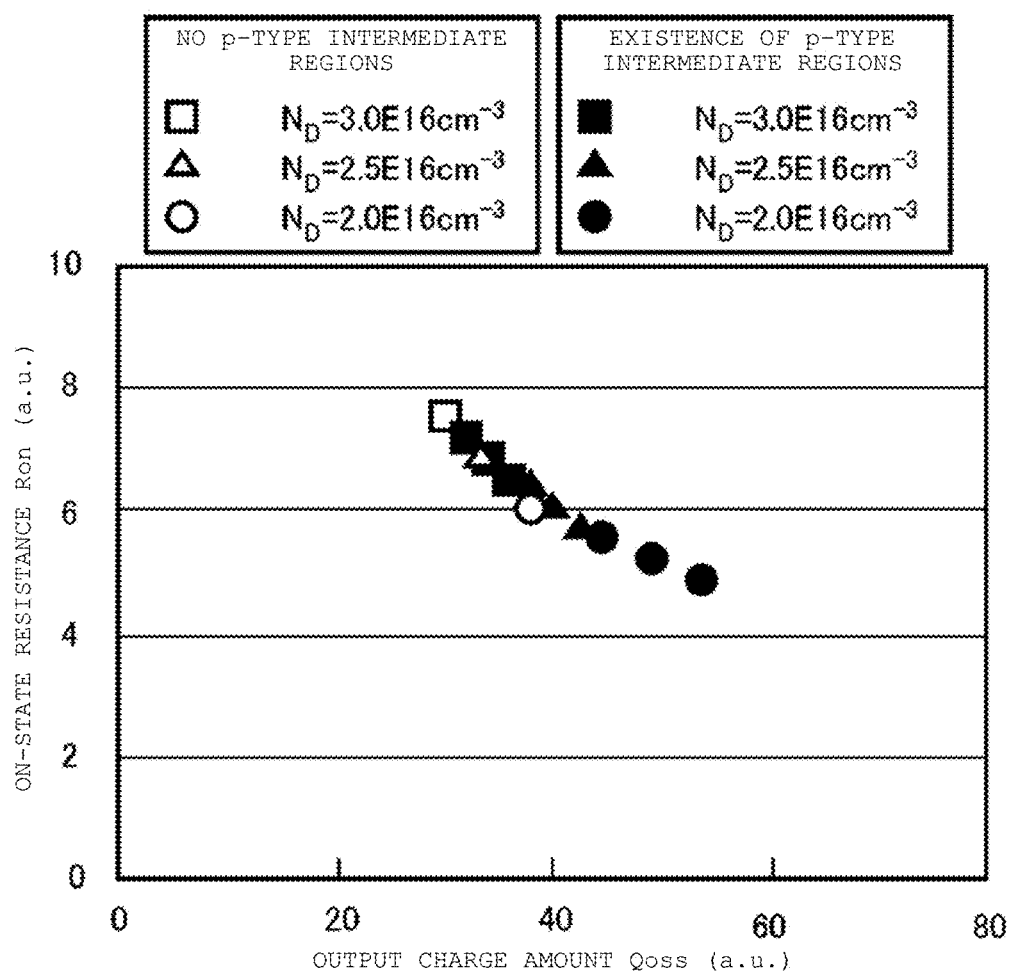
FIG. 5 is an explanatory diagram of an action and an effect of the semiconductor device according to the first embodiment.

FIG. 5 is a diagram illustrating a simulation result of a relation between the output charge amount (Qoss) and on-state resistance (Ron) of the MOSFET. The horizontal axis represents the output charge amount (Qoss), and the vertical axis represents the on-state resistance (Ron). The simulation result illustrates a case where the concentration of the n-type impurity of the drift region 14 is $2.0 \times 10^{16}$ cm$^{-3}$, $2.5 \times 10^{16}$ cm$^{-3}$, and $3.0 \times 10^{16}$ cm$^{-3}$. In FIG. 5, an open, i.e., black outlined white center symbol indicates a case where the p-type intermediate region is not provided, and a solid black symbol indicates a case where the p-type intermediate region is provided. The number of the p-type intermediate regions 21 provided in the simulation is varied in a range from one to three.

Even in the case where the p-type intermediate region is provided, similar to the case where no p-type intermediate region is provided, a tradeoff relationship exists between the output charge amount (Qoss) and the on-state resistance (Ron). However, when the p-type intermediate region is provided, it is possible to control the MOSFET to include a desired relationship between the output charge amount (Qoss) and the on-state resistance (Ron). For example, it is possible to decrease the output charge amount (Qoss) by reducing the on-state resistance (Ron).

As illustrated in FIG. 2 to FIG. 5, the MOSFET 100 according to the embodiment includes the p-type first intermediate region 21a, the p-type second intermediate region 21b, and the p-type third intermediate region 21c, and thus it is possible to decrease the output capacitance (Coss) and the output charge amount (Qoss). Accordingly, it is possible to realize the MOSFET in which the switching efficiency is improved.

In addition, for example, when the distance between the p-type first intermediate region 21a, the p-type second intermediate region 21b, and the p-type third intermediate region 21c is changed, it is possible to control the shape of the Coss-Vds curve to be a desired shape. Accordingly, it is possible to realize the MOSFET including the Coss-Vds curve which is suitable to applications. For example, it is possible to realize the MOSFET which is capable of preventing switching noise.

It is possible to control the shape of the Coss-Vds curve by changing, for example, the number of the p-type intermediate regions, their impurity concentration, their width, and their height.

Note that, in order to secure a path of a carrier in a state where the MOSFET 100 is turned on, the drift region 14 is interposed between the first intermediate region 21a, the second intermediate region 21b, and the third intermediate region 21c, and the first field plate insulating film 28. Similarly, the drift region 14 is interposed between the first intermediate region 21a, the second intermediate region 21b, and the third intermediate region 21c, and the second field plate insulating film 29.

Further, it is desired that the width of the p-type first intermediate region 21a in the direction perpendicular to the first surface is smaller than the distance between the p-type first intermediate region 21a and the p-type body region 16. When the p-type first intermediate region 21a and the p-type body region 16 are excessively close to each other, there is a concern in that the electric field distribution of the drift region 14 will rapidly change, and the breakdown voltage of the MOSFET 100 will vary In addition, when the width of the first intermediate region 21a is large, there is a concern in that the n-type region in the drift region 14 is decreased, and the on-state resistance will become higher.

Further, it is desired that the width of the p-type second intermediate region 21b in the direction perpendicular to the first surface is smaller than the distance between the p-type second intermediate region 21b and the p-type first intermediate region 21a. When the p-type second intermediate region 21b and the p-type first intermediate region 21a are excessively close to each other, there is a concern that the electric field distribution of the drift region 14 will rapidly change, and the breakdown voltage of the MOSFET 100 will vary. In addition, when the width of the second intermediate region 21b is large, there is a concern that the n-type region in the drift region 14 is decreased and the on-state resistance will become higher.

Further, it is desired that the width of the p-type third intermediate region 21c in the direction perpendicular to the first surface is smaller than the distance between the p-type third intermediate region 21c and the p-type second intermediate region 21b. When the p-type third intermediate region 21c and the p-type second intermediate region 21b are excessively close to each other, there is a concern that the electric field distribution of the drift region 14 will rapidly change, and the breakdown voltage of the MOSFET 100 will vary. In addition, when the width of the third intermediate region 21c is large, there is a concern that the n-type region in the drift region 14 is decreased, and the on-state resistance will become higher.

As described above, in the MOSFET 100 according to the embodiment, it is possible to decrease the output capacitance (Coss) which is the parasitic capacitance of the MOSFET 100. As a result, it is possible to decrease the output charge amount (Qoss) of the MOSFET 100. In addition, it is possible to control the shape of the Coss-Vds curve to be a desired shape. Accordingly, it is possible to realize a MOSFET 100 with excellent properties.

Second Embodiment

The semiconductor device of the embodiment is the same as that of the first embodiment except that the first gate electrode is in contact with the first field plate electrode, and the second gate electrode is in contact with the second field plate electrode. Accordingly, the same content as that in the first embodiment will not be described.

Figure 6:
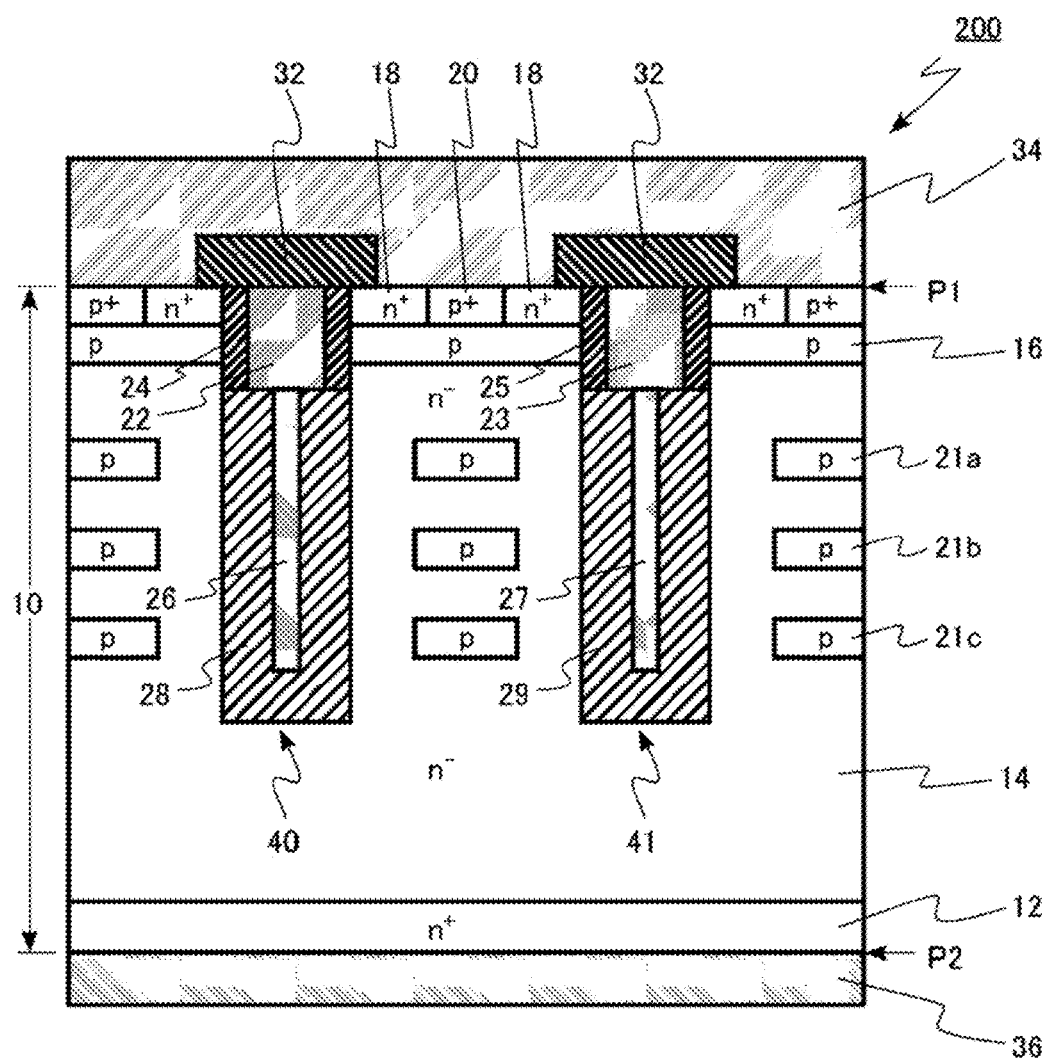
FIG. 6 is a schematic sectional view of a semiconductor device according to a second embodiment.

FIG. 6 is a schematic sectional view of the semiconductor device according to the embodiment. A semiconductor device 200 according to the embodiment is a vertical power MOSFET which includes a gate electrode in a trench.

In the MOSFET 200, the first gate electrode 22 and the first field plate electrode 26 are electrically and physically connected to each other. In addition, the second gate electrode 23 and the second field plate electrode 27 are electrically and physically connected to each other.

Accordingly, the gate voltage is applied to the first field plate electrode 26 and the second field plate electrode 27.

According to the MOSFET 200 according to this embodiment, by the same actions as those according to first embodiment, it is possible to decrease the output capacitance (Coss) which is the parasitic capacitance of the MOSFET 200. As a result, it is possible to decrease the output charge amount (Qoss) of the MOSFET 200. In addition, it is possible to control the shape of the Coss-Vds curve to be a desired shape. Accordingly, it is possible to achieve the MOSFET 200 with excellent properties.

Note that, in the MOSFET 200 according to the embodiment, in a state where the MOSFET 200 is turned on, the gate voltage is applied to the semiconductor region on the side surface of the first trench 40 and the second trench 41.

Figure 7:
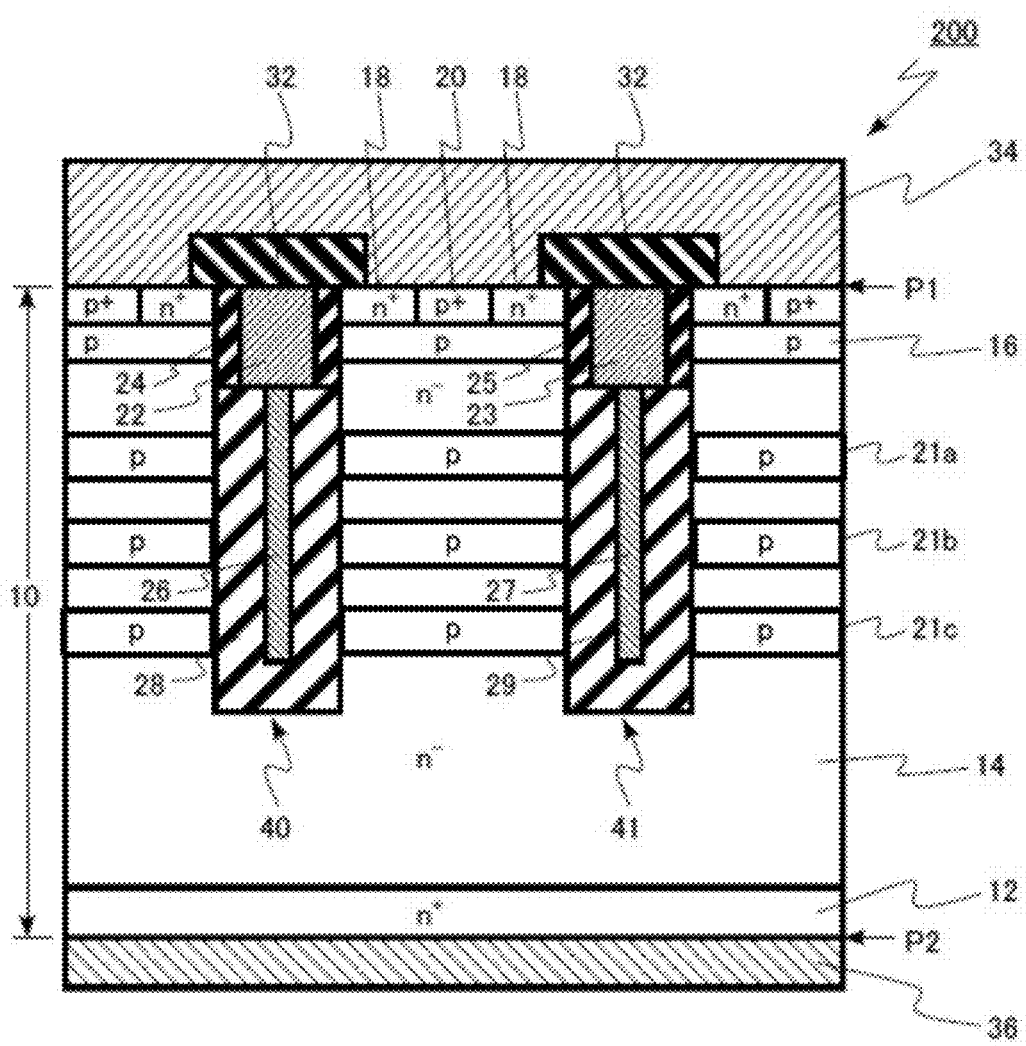
FIG. 7 is a schematic sectional view of a semiconductor device according to of a modification example of the second embodiment.

FIG. 7 is a schematic sectional view of a semiconductor device according to of a modification example of the second embodiment. Accordingly, when the proper p-type impurity concentration is selected, the first intermediate region 21a, the second intermediate region 21b, or the third intermediate region 21c can be in contact with the first field plate insulating film 28 shown in FIG. 7. In addition, the first intermediate region 21a, the second intermediate region 21b, or the third intermediate region 21c can be in contact with the second field plate insulating film 29.

As described above, in the first and second embodiments, examples of cases where the first conductivity type is an n type, and the second conductivity type is a p type are described; however, it is possible that the first conductivity type is a p type, and the second conductivity type is an n type.

Further, in the first and second embodiments, silicon is exemplified as a semiconductor material; however, it is possible to use other semiconductor materials such as silicon carbide (SiC), and gallium nitride (GaN).

In addition, in the first and second embodiments, a case where the thickness of each of the first field plate insulating film 28 and the second field plate insulating film 29 is set to be a certain thickness is described; however, it is possible that the thickness of the first field plate insulating film 28 and the second field plate insulating film 29 has multiple layers, or the thickness thereof is continuously changed in the depth direction, and thus the drain-to-source breakdown voltage is improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a semiconductor layer having a first surface and a second surface;
   a first semiconductor region of a first conductivity type in the semiconductor layer;
   a second semiconductor region of a second conductivity type in the semiconductor layer between the first semiconductor region and the first surface;
   a third semiconductor region of the first conductivity type in the semiconductor layer between the second semiconductor region and the first surface;
   a first gate electrode on the semiconductor layer;
   a second gate electrode on the semiconductor layer, wherein the second semiconductor region is between the first gate electrode and the second gate electrode;
   a first field plate electrode between the second surface and the first gate electrode;
   a second field plate electrode between the second surface and the second gate electrode;
   a first insulating film having at least a portion between the first field plate electrode and the first semiconductor region;
   a second insulating film having at least a portion between the second field plate electrode and the first semiconductor region; and
   a plurality of fourth semiconductor regions of the second conductivity type in the first semiconductor region between and separated from the first insulating film and the second insulating film, wherein the plurality of fourth semiconductor regions are separated from each other and the second semiconductor region by the first semiconductor region, wherein
   a width of each fourth semiconductor region in a direction perpendicular to the first surface is less than a distance between adjacent fourth semiconductor regions.

2. The semiconductor device according to claim 1, wherein:
   the first semiconductor region is between the plurality of fourth semiconductor regions and the first insulating film, and
   the first semiconductor region is between the plurality of fourth semiconductor regions and the second insulating film.

3. The semiconductor device according to claim 1, wherein the width of each fourth semiconductor region in the direction perpendicular to the first surface is smaller than the distance between the fourth semiconductor region and the second semiconductor region.

4. The semiconductor device according to claim 1, further comprising:
   a fifth semiconductor region of the second conductivity type in the first semiconductor region between the fourth semiconductor region and the second surface, wherein a portion of the first semiconductor region is between the fourth semiconductor region and the fifth semiconductor region; and
   a sixth semiconductor region of the second conductivity type in the first semiconductor region between the fifth semiconductor region and the second surface, wherein at least a portion of the first semiconductor region is between the fifth semiconductor region and the sixth semiconductor region.

5. The semiconductor device according to claim 4, wherein the widths of the first, second, and third semiconductor regions in the direction perpendicular to the first surface is greater than the thicknesses thereof, respectively, in the direction perpendicular to the first surface.

6. The semiconductor device according to claim 1, wherein:
the first insulating film is between the first field plate electrode and the first gate electrode, and
the second insulating film is between the second field plate electrode and the second gate electrode.

7. The semiconductor device according to claim 1, wherein the first gate electrode and the first field plate electrode contact each other.

8. The semiconductor device according to claim 7, wherein the second gate electrode and the second field plate electrode contact each other.

9. The semiconductor device according to claim 1, wherein the first and second field plate electrodes and the first and second gate electrodes comprise polysilicon.

10. A semiconductor device, comprising:
a semiconductor layer comprising a first surface and a second surface opposed to the first surface, the semiconductor layer comprising:
a first region of a first conductivity type extending into the semiconductor layer from the first surface;
a second region of a second conductivity type between the first region and the first surface;
a third region of the first conductivity type between the second region and the first surface; and
a plurality of fourth regions of the second conductivity type between the second region and the second surface, wherein
the fourth regions are separated from each other and the second semiconductor region by portions of the first region, and
a width of each fourth region in a direction perpendicular to the first surface is less than a distance between adjacent fourth regions;
a first trench extending inwardly of the first surface and terminating within the first region; and
a second trench extending inwardly of the first surface and terminating within the first region,
wherein the plurality of fourth semiconductor regions is between and separated from the first and second trenches in a portion of the first region that extends from the first trench to the second trench and contacts the second region.

11. The semiconductor device according to claim 10, further comprising:
a first field plate electrode in the first trench and extending therein in a direction between the first and second surfaces; and
a first insulating layer extending between the first field plate electrode and the adjacent inner surfaces of the first trench.

12. The semiconductor device according to claim 11, further comprising a gate electrode in the first trench and overlying the first field plate electrode.

13. The semiconductor device according to claim 12, wherein the semiconductor layer further comprises a fifth region of the second conductivity type between the first and the second trenches, and between the fourth region and the second surface.

14. The semiconductor device according to claim 12, wherein the semiconductor layer further comprises a sixth region of the second conductivity type between the second region and the first surface, wherein the third region is located on the sides of the sixth region in a direction parallel to the first surface, and wherein a first electrode overlies the first surface and contacts the third region and the sixth region.

15. The semiconductor device according to claim 14, further comprising a second insulating layer between the first gate electrode and the second region, the third region, and the first electrode.

16. The semiconductor device according to claim 15, further comprising a second electrode overlying the second surface and contacting the first region.

17. The semiconductor device according to claim 14, wherein a concentration of second conductivity type impurity is greater in the sixth region than a concentration of second conductivity type impurity in the second region.

18. A semiconductor device, comprising:
a first electrode;
a first semiconductor layer of a first conductivity type on the first electrode;
a second semiconductor layer of a second conductivity type on the first semiconductor layer;
a third semiconductor layer of the first conductivity type on the second semiconductor layer;
a plurality of trenches extending through the third semiconductor layer and the second semiconductor layer and terminating in the first semiconductor layer, at least two adjacent trenches in the plurality of trenches including a field plate electrode and a gate electrode located therein, wherein the field plate electrode is between the gate electrode and the first electrode; and
a plurality of fourth semiconductor layers of the second conductivity type between the at least two adjacent trenches, and between the first electrode and the second semiconductor layer, wherein
the fourth semiconductor layers are in the first semiconductor layer and separated from each other, the plurality of trenches, and the first electrode by a portion of the first semiconductor layer, and
a thickness of each fourth semiconductor layer is less than a distance between adjacent fourth semiconductor layers.

19. The semiconductor device according to claim 18, wherein the thickness of the fourth semiconductor layer of the plurality of fourth semiconductor layers that is closest to the second semiconductor layer is less than the distance between that fourth semiconductor layer and the second semiconductor layer.

20. The semiconductor device according to claim 19, wherein the thicknesses of adjacent fourth semiconductor layers in the plurality of fourth semiconductors are different.

* * * * *